US008466068B2

(12) United States Patent
Scheuerlein

(10) Patent No.: US 8,466,068 B2
(45) Date of Patent: Jun. 18, 2013

(54) METHODS AND APPARATUS FOR FORMING MEMORY LINES AND VIAS IN THREE DIMENSIONAL MEMORY ARRAYS USING DUAL DAMASCENE PROCESS AND IMPRINT LITHOGRAPHY

(75) Inventor: Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 250 days.

(21) Appl. No.: 11/967,638

(22) Filed: Dec. 31, 2007

(65) Prior Publication Data
US 2009/0166682 A1   Jul. 2, 2009

(51) Int. Cl.
*H01L 21/311* (2006.01)
*H01L 21/302* (2006.01)

(52) U.S. Cl.
USPC ............... 438/700; 438/689; 257/E21.251

(58) Field of Classification Search
USPC ............ 257/211, E27.07, E21.251; 438/700, 438/689; 430/5
See application file for complete search history.

(56) References Cited

U.S. PATENT DOCUMENTS

| | | | |
|---|---|---|---|
| 6,420,215 B1 | 7/2002 | Knall et al. | |
| 6,515,888 B2 | 2/2003 | Johnson et al. | |
| 6,534,403 B2 | 3/2003 | Cleeves | |
| 6,822,903 B2 | 11/2004 | Scheuerlein | |
| 6,951,780 B1 | 10/2005 | Herner | |
| 6,963,504 B2 | 11/2005 | Scheuerlein | |
| 7,091,084 B2 | 8/2006 | Kellar et al. | |
| 7,148,142 B1 * | 12/2006 | Dakshina-Murthy et al. | 438/678 |
| 7,195,950 B2 | 3/2007 | Taussig | |
| 7,256,435 B1 | 8/2007 | Kornilovich et al. | |
| 7,396,465 B2 * | 7/2008 | Wu et al. | 210/500.21 |
| 7,396,475 B2 * | 7/2008 | Sreenivasan | 216/2 |
| 7,410,904 B2 * | 8/2008 | Stasiak et al. | 438/700 |
| 7,462,292 B2 * | 12/2008 | Lee | 216/54 |
| 7,474,000 B2 | 1/2009 | Scheuerlein et al. | |
| 7,505,321 B2 | 3/2009 | Scheuerlein et al. | |
| 7,508,714 B2 | 3/2009 | Fasoli et al. | |
| 7,795,149 B2 * | 9/2010 | Sandhu | 438/694 |
| 7,883,764 B2 | 2/2011 | Murao | |

(Continued)

FOREIGN PATENT DOCUMENTS

| CN | 1487362 A | 4/2004 |
|---|---|---|
| CN | 1698181 A | 11/2005 |

(Continued)

OTHER PUBLICATIONS

International Search Report and Written Opinion of International Application No. PCT/US2008/088628 mailed Jul. 29, 2009.

(Continued)

*Primary Examiner* — Matthew Reames
*Assistant Examiner* — Benjamin Tzu-Hung Liu
(74) *Attorney, Agent, or Firm* — Dugan & Dugan, PC

(57) ABSTRACT

The present invention provides systems, apparatus, and methods for forming three dimensional memory arrays using a multi-depth imprint lithography mask and a damascene process. An imprint lithography mask for manufacturing a memory layer in a three dimensional memory is described. The mask includes a translucent material formed with features for making an imprint in a transfer material to be used in a damascene process, the mask having a plurality of imprint depths. At least one imprint depth corresponds to trenches for forming memory lines and at least one depth corresponds to holes for forming vias. Numerous other aspects are disclosed.

21 Claims, 7 Drawing Sheets

U.S. PATENT DOCUMENTS

| | | | |
|---|---|---|---|
| 7,928,004 B2 * | 4/2011 | Seidel et al. | 438/637 |
| 8,003,310 B2 | 8/2011 | Sandhu | |
| 2001/0050385 A1 * | 12/2001 | Kotecki et al. | 257/296 |
| 2002/0088998 A1 | 7/2002 | Knall et al. | |
| 2004/0245547 A1 | 12/2004 | Stipe | |
| 2005/0062165 A1 | 3/2005 | Saenger et al. | |
| 2005/0170269 A1 | 8/2005 | Nakagawa et al. | |
| 2006/0240681 A1 | 10/2006 | Williams et al. | |
| 2007/0210449 A1 | 9/2007 | Caspary et al. | |
| 2007/0281219 A1 | 12/2007 | Sandhu | |
| 2008/0167396 A1 | 7/2008 | Murao | |
| 2009/0166682 A1 | 7/2009 | Scheuerlein | |
| 2010/0301449 A1 | 12/2010 | Scheuerlein | |
| 2011/0228589 A1 | 9/2011 | Murooka | |

FOREIGN PATENT DOCUMENTS

| | | |
|---|---|---|
| CN | 1791967 A | 6/2006 |
| EP | 1 387 216 | 2/2004 |
| EP | 1 796 159 | 6/2007 |
| KR | 10-2004-0012563 | 2/2004 |
| WO | WO 01/20402 | 3/2001 |
| WO | WO 03/030252 | 4/2003 |
| WO | WO 2010/041302 | 4/2010 |

OTHER PUBLICATIONS

Extended Search Report of counterpart European Patent Application No. 08870141.2 mailed Mar. 19, 2012.

First Office Action and Search Report of counterpart Chinese Patent Application No. 200880123672.4 mailed Jun. 26, 2012.

Communication pursuant to Rules 70(2) and 70a(2) EPC of counterpart European Patent Application No. 08870141.2 mailed Apr. 5, 2012.

Oct. 24, 2012 Response to Jun. 26, 2012 Office Action and Search Report of counterpart Chinese Patent Application No. 200880123672.4.

Office Action of counterpart Chinese Patent Application No. 200880123672.4 dated Jan. 30, 2013.

Apr. 15, 2013 Reply to Jan. 30, 2013 Office Action of counterpart Chinese Patent Application No. 200880123672.4.

* cited by examiner

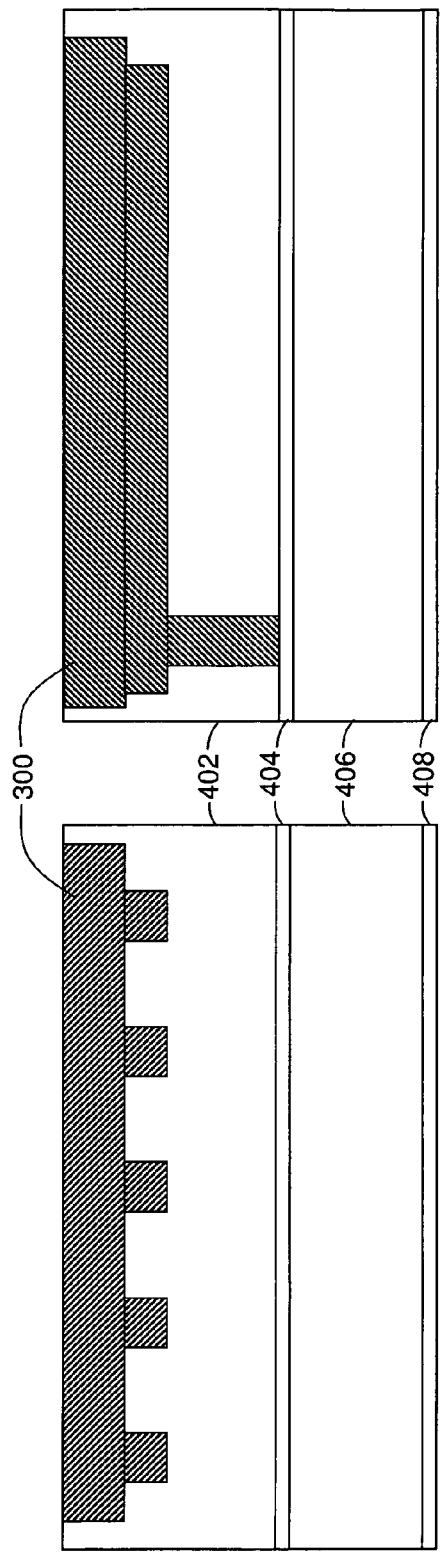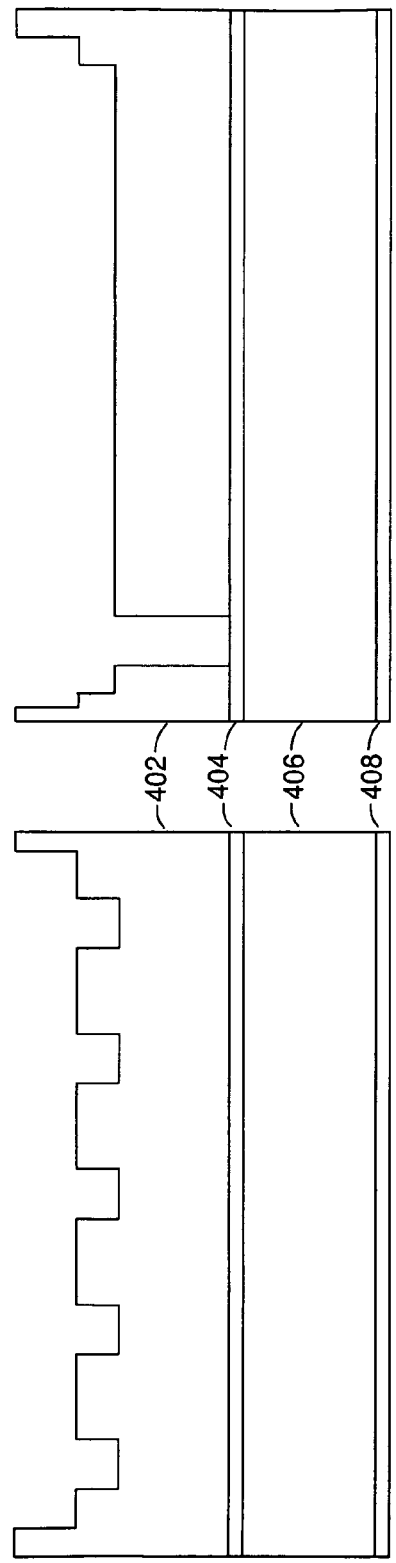

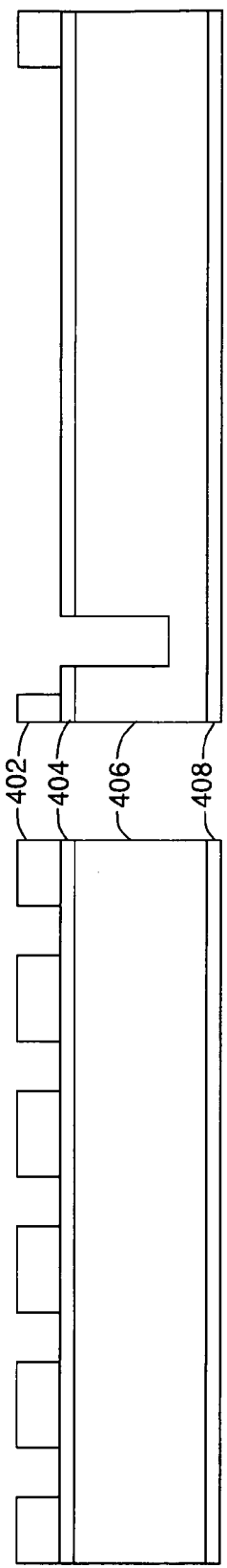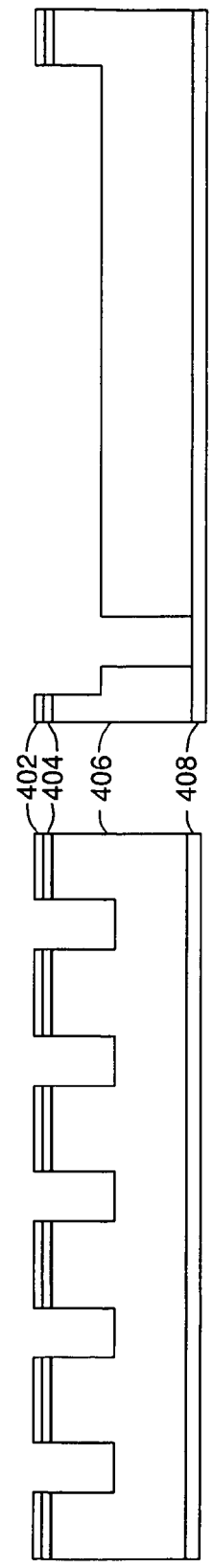

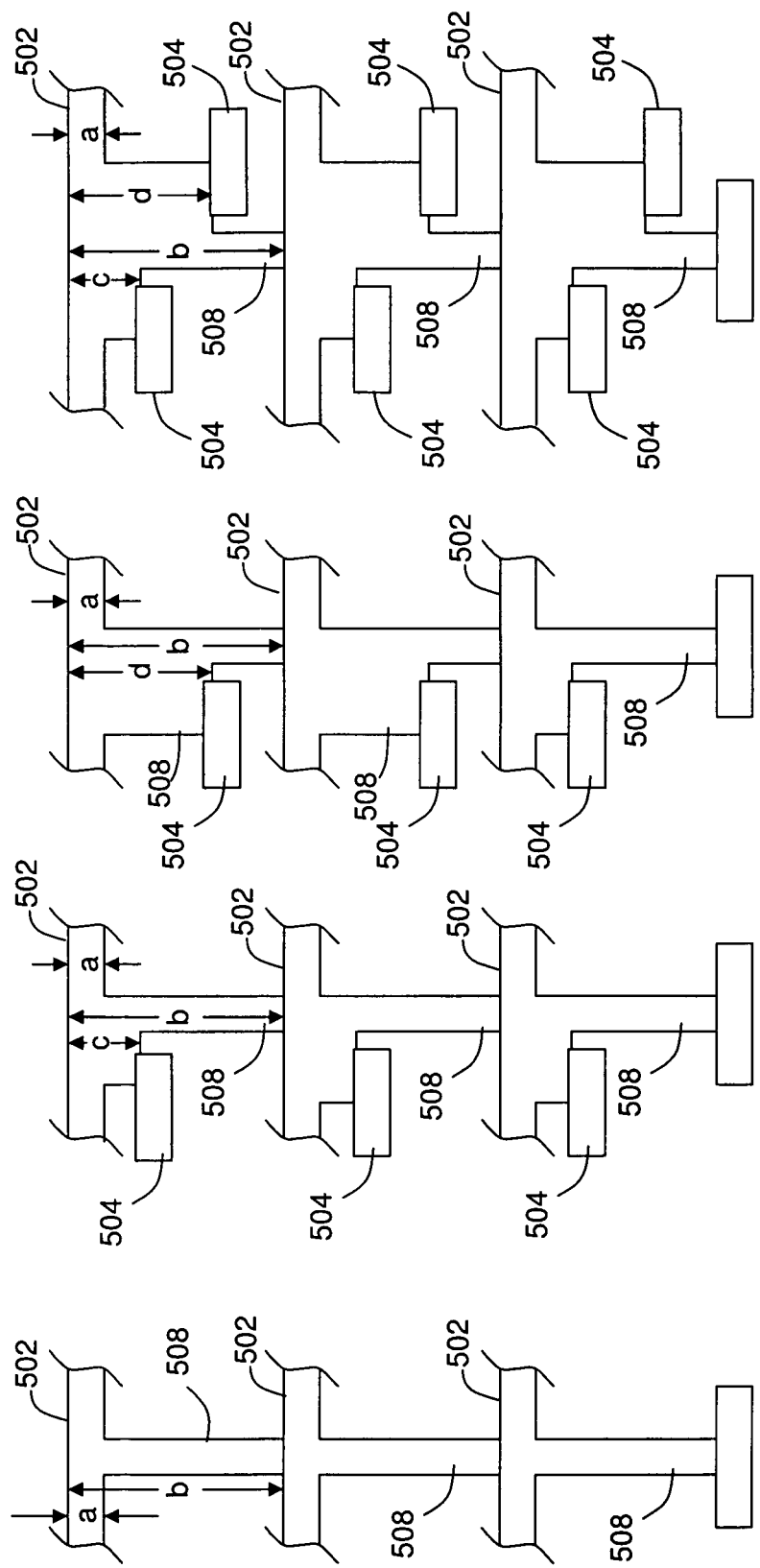

METHODS AND APPARATUS FOR FORMING MEMORY LINES AND VIAS IN THREE DIMENSIONAL MEMORY ARRAYS USING DUAL DAMASCENE PROCESS AND IMPRINT LITHOGRAPHY

CROSS REFERENCE TO RELATED APPLICATIONS

The present application is related to the following patent applications, each of which is hereby incorporated by reference herein in its entirety for all purposes:

U.S. patent application Ser. No. 10/728,451, filed on Dec. 5, 2003, and entitled "High Density Contact to Relaxed Geometry Layers";

U.S. patent application Ser. No. 11/751,567, filed on May 21, 2007, and entitled "Memory Array Incorporating Memory Cells Arranged in NAND Strings";

U.S. patent application Ser. No. 10/335,078, filed on Dec. 31, 2002, and entitled "Programmable Memory Array Structure Incorporating Series-Connected Transistor Strings and Methods for Fabrication and Operation of Same;" and U.S. Pat. No. 6,951,780, issued Oct. 4, 2005, and entitled "Selective Oxidation of Silicon in Diode, TFT, and Monolithic Three Dimensional Memory Arrays."

FIELD OF THE INVENTION

The present invention relates to semiconductor manufacturing techniques and more particularly to forming memory lines and vias in three dimensional memory arrays using dual damascene process and imprint lithography.

BACKGROUND

The formation of deep vias (e.g., vias that span and/or connect multiple levels of memory elements in a monolithic three dimensional memory array, also known as zias as will be explained below) conventionally requires the use of relatively expensive leading edge etch tools. Further, each of the mask steps involved in forming deep vias conventionally require the use of relatively expensive leading edge immersion lithography tools and techniques. Further, formation of deep vias using immersion lithography when feature sizes reach 32 nm to 15 nm will become even more costly and may not even be possible. Thus, what is needed are methods and apparatus that do not require the use of immersion lithography and that reduce the cost of manufacturing deep, submicron three-dimensional memory arrays that use deep vias.

SUMMARY

According to aspects of the present invention, a method of forming a memory layer in a three-dimensional memory array is provided. The method includes forming a template having a plurality of depths, wherein at least one depth corresponds to a first memory line and wherein at least one depth corresponds to a via; imprinting the template into a transfer material; curing the transfer material; and forming a memory layer using the imprinted and cured transfer material.

According to other aspects, the present invention provides a memory layer in a three-dimensional memory array. The memory layer includes a plurality of memory lines and vias formed by a damascene process using an imprint lithography template having a plurality of depths, wherein at least one depth corresponds to the memory lines and wherein at least one depth corresponds to the vias; and a plurality of memory cells operatively coupled to the memory lines.

According to other aspects, the present invention provides an imprint lithography mask for manufacturing a memory layer in a three dimensional memory. The mask includes a translucent material formed with features for making an imprint in a transfer material to be used in a damascene process, the mask having a plurality of imprint depths. At least one imprint depth corresponds to trenches for forming memory lines and wherein at least one depth corresponds to holes for forming vias.

According to other aspects, the present invention provides a three dimensional memory array that includes a plurality of horizontal memory layers formed on top of each other and electrically coupled to each other by vertical zias, the zias formed from aligned vias in each memory layer, and the memory layers including a plurality of memory lines and the vias, both formed concurrently using an imprint lithography mask.

Other features and aspects of the present invention will become more fully apparent from the following detailed description, the appended claims and the accompanying drawings.

BRIEF DESCRIPTION OF THE DRAWINGS

FIGS. 4AX through 4DX and 4AY through 4DY depict a sequence of cross-sectional views (from a front (X) and a side (Y) perspective, respectively) of a substrate with various process layers, the sequence representing a method of forming a layer of memory lines and vias in accordance with embodiments of the present invention.

FIGS. 5A through 5D depict cross-sectional views of different columns of zias connecting adjacent word line layers and, if present, bit lines at different depths in accordance with embodiments of the present invention.

DETAILED DESCRIPTION

Figure 1:
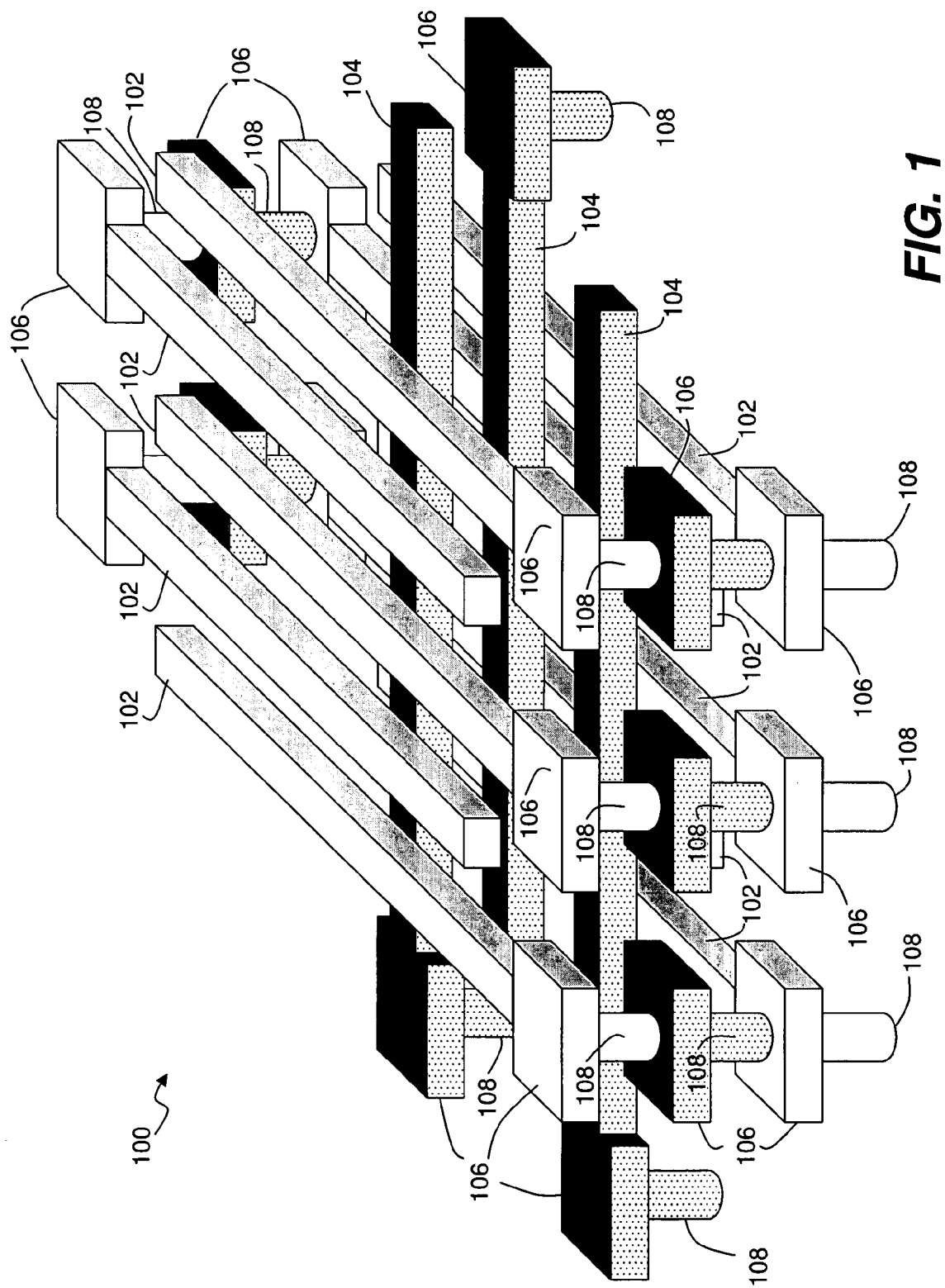
FIG. 1 is a perspective view of a structural representation of interleaved word lines and bit lines of a simplified example three-dimensional memory array according to embodiments of the present invention.

The present invention provides methods and apparatus for forming a three-dimensional memory array (e.g., a monolithic three-dimensional memory array with multiple levels on a single substrate and/or stacked levels of two-dimensional arrays formed on different substrates and subsequently bonded together) using a double depth imprint lithography mask (e.g., a 3D template) to concurrently form trenches and holes for memory lines and vias to adjacent memory levels, respectively. More specifically, each line and via are formed using a dual damascene process where the first feature of the dual damascene process may be a word or bit line and the second feature may be a via leading from the word or bit line.

In some embodiments, multiple depth imprint lithography masks may be used to concurrently form trenches and different depth holes for memory lines and vias to different depth features such as other bit and/or word lines as well as to an adjacent memory level.

In another aspect of the invention and in some embodiments, memory lines may be interleaved such that enlarged contact pad regions formed as an extension at one end of each line are disposed in an alternating manner on opposite sides of the three-dimensional memory array. In other words, adjacent lines may have their associated enlarged pad regions at opposite ends relative to each other. Thus, the interleaving provides additional area for the enlarged pad regions which are provided for contacting vias extending from other memory lines. By enlarging the pad regions, alignment to the vias is less critical.

In some embodiments, word lines and bit lines may both be formed with vias extending from the word lines and bit lines as indicated above. In some embodiments, only the word lines may be formed concurrently with vias. In such embodiments, the imprint lithography mask used for word lines may have two depths: a first depth for forming the word lines and a second depth used to form holes for both full depth vias that will reach a next word line and relatively short vias that reach a next bit line. In such embodiments, the via shape may overlap the bit line edge. Likewise, in some embodiments, only the bit lines may be formed concurrently with vias. In some embodiments, the imprint lithography mask used may have three depths: a first depth for forming the word lines, a second depth used to form holes for full depth vias that will reach a next word line, and a third depth used to form holes for relatively short vias that reach a next bit line. In some embodiments, the imprint lithography mask used may have four depths: a first depth for forming the word lines, a second depth used to form holes for full depth vias that will reach a next word line, a third depth used to form holes for relatively short depth vias that reach an upper bit line layer, and a fourth depth used to form holes for medium depth vias that reach a lower bit line layer. Other imprint lithography masks having other numbers of depths may be used.

In some embodiments, a multi-level memory array according to the present invention includes memory cells formed on each of several memory planes or memory levels. Strings of memory cells on more than one layer may be connected to global bit lines on a single layer. Such a global bit line layer may be disposed on a layer of a monolithic integrated circuit below all the memory levels for more convenient connection to support circuitry for the memory array, which may be disposed in the substrate below the array. In some embodiments such a global bit line layer may reside in the midst of the memory levels, or above the array, and more than one global bit line layer may be used. Moreover, the strings of memory cells on more than one layer may also be connected to shared bias nodes on a single layer, which may be disposed above all the memory levels. In some embodiments, the shared bias nodes may reside in the midst of the memory levels, or below the array. The shared bias nodes may likewise be disposed on more than one layer.

Because some memory arrangements (e.g., a non-mirrored arrangement) may use a global bit line for each adjacent string of memory cells, the pitch of global bit lines may be tighter than for other arrangements in which adjacent strings of memory cells share the same global bit line. To alleviate global bit line pitch problems, in certain embodiments global bit lines may be routed on two or more wiring layers. For example, even-numbered strings of memory cells may be associated with global bit lines disposed on one global bit line layer, while odd-numbered strings of memory cells may be associated with global bit lines disposed on another global bit line layer. Thus, it may be desirable to have vias that reach down to different levels of bit lines between word lines layers. It may also be desirable to stagger vias to help match the pitch of strings of memory cells, and the required global bit line pitch relaxed to twice the pitch of individual strings of memory cells.

Vertical vias that contact more than two vertically adjacent layers may also be used, particularly for three-dimensional arrays having more than one plane of memory cells. Such a vertical connection may be conveniently termed a "zia" to imply a via-type structure connecting more than one layer in the z-direction. Preferred zia structures and related methods for their formation are described in U.S. Pat. No. 6,534,403 to Cleeves, issued Mar. 18, 2003, the disclosure of which is hereby incorporated by reference in its entirety. Additional details of exemplary zias are described in previously incorporated U.S. patent application Ser. No. 10/335,078.

Turning to FIG. 1, a perspective view, structural representation 100 of interleaved word lines 102 and bit lines 104 of a simplified example three-dimensional memory array is depicted. The depicted interleaved memory lines 102, 104 illustrate features formed by the methods and apparatus of the present invention. Details of the conventional aspects of forming three-dimensional memory arrays may be found in previously incorporated U.S. patent application Ser. No. 11/751,567. In other embodiments a multi-level memory array FIG. 1 according to the present invention includes memory cells (not shown) comprising a vertical diode and resistance changing layer in series at the crossing location of the word lines 102 and bit lines 104. An example of such a cross point diode memory array is described in more detail in above referenced U.S. Pat. No. 6,951,780. In the present invention, each word line 102 (and each bit line 104) may include an enlarged contact pad region 106 at one end of the word line 102 (or bit line 104). Vias 108, extending down from each word line 102 and each bit line 104 are aligned to contact the enlarged contact pad region 106. Thus, the alignment of the vias 108 to the lower memory array lines 102, 104 is relaxed by interleaving. Interleaving enhances the advantage of imprint lithography by allowing use of a minimum pitch while enjoying a larger tolerance for via alignment. In such an embodiment, the line width and pitch may be scaled more than the via alignment variation. For example, 22 nm wide word lines 102 may be formed at a pitch of approximately 44 nm, however the effective line pitch at the via location maybe approximately 88 nm. In certain arrangements, alignment variation between layers may be as much as 22 nm. The methods of the present invention are scalable because the damascene process allows formation of more robust memory lines 102, 104 at a smaller feature size. Also, with regard to filling holes to form vias, the aspect ratio of the vias is not as challenging as with manufacturing prior art three dimensional memory arrangements because in the present invention, each memory line layer is associated with a via 108. Note that, unlike prior art three dimensional memory designs, each word line layer is connected to the next word line layer by an intervening pad 106 shaped on the bit line layers and vias 108 associated with the dual damascene bit line layer.

Figure 2:
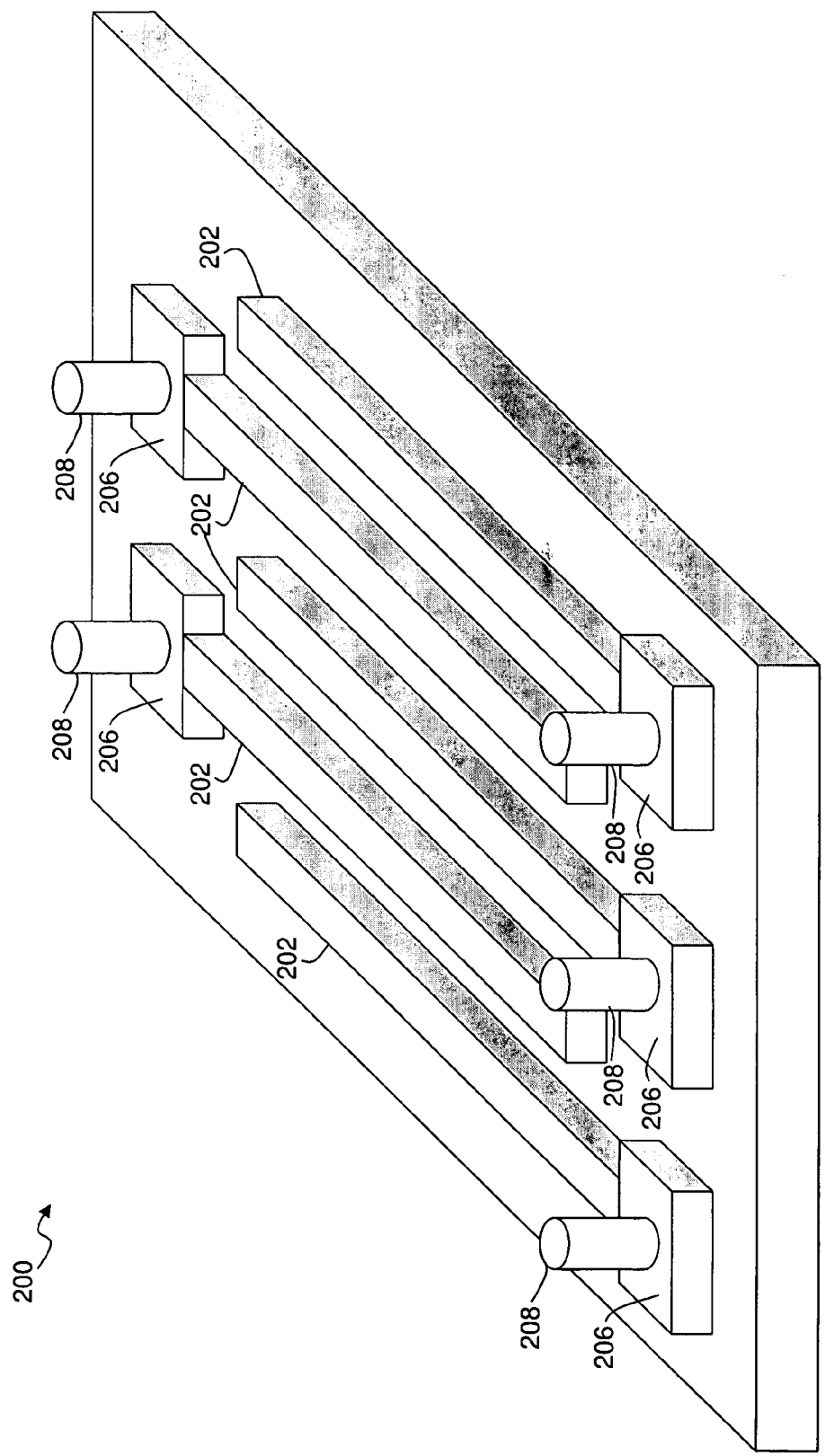
FIG. 2 is a perspective view of an example imprint lithography mask suitable for forming the memory lines of the three-dimensional memory array of FIG. 1 according to embodiments of the present invention.

Turning to FIG. 2, an example of an imprint lithography mask 200 or template suitable for use in forming the memory lines 102, 104 and vias 108 of the three-dimensional memory array shown in FIG. 1 is depicted. The imprint lithography mask 200 or template is formed by etching a desired pattern into a translucent blank made from, for example, quartz or fused silica. As shown, the imprint mask 200 includes interleaved rails 202 (corresponding to trenches) with wider landings 206 for forming contact pads at alternating ends of the rails 202. Pillars 208 (corresponding to vias) project upwards from the top surface of each of the landings 206. The imprint lithography mask 200 may be formed at the minimum dimensions (e.g., line width and pitch) achievable by whichever technology (e.g., 32 nm, 16 nm, 9 nm photolithography, immersion lithography, etc.) may be used to pattern the mask 200. Because a single mask 200 may be used repeatedly to form many layers of interconnect structures, the cost of manufacturing the mask 200 may be spread over each use of the mask 200. Thus a net manufacturing cost reduction may be achieved by the methods and apparatus of the present invention.

In operation, the imprint lithography mask 200 is inverted from the orientation shown and used to imprint its complement shape into a liquid transfer layer. The liquid transfer layer is then hardened or cured by exposure to light (e.g., ultraviolet) or other radiation transmitted directly through the translucent imprint lithography mask 200. As will be described in more detail below, the hardened or cured transfer layer may be used during oxide etch to transfer the features of the imprint lithography mask 200 into a dielectric (e.g., oxide) layer.

Figure 3:
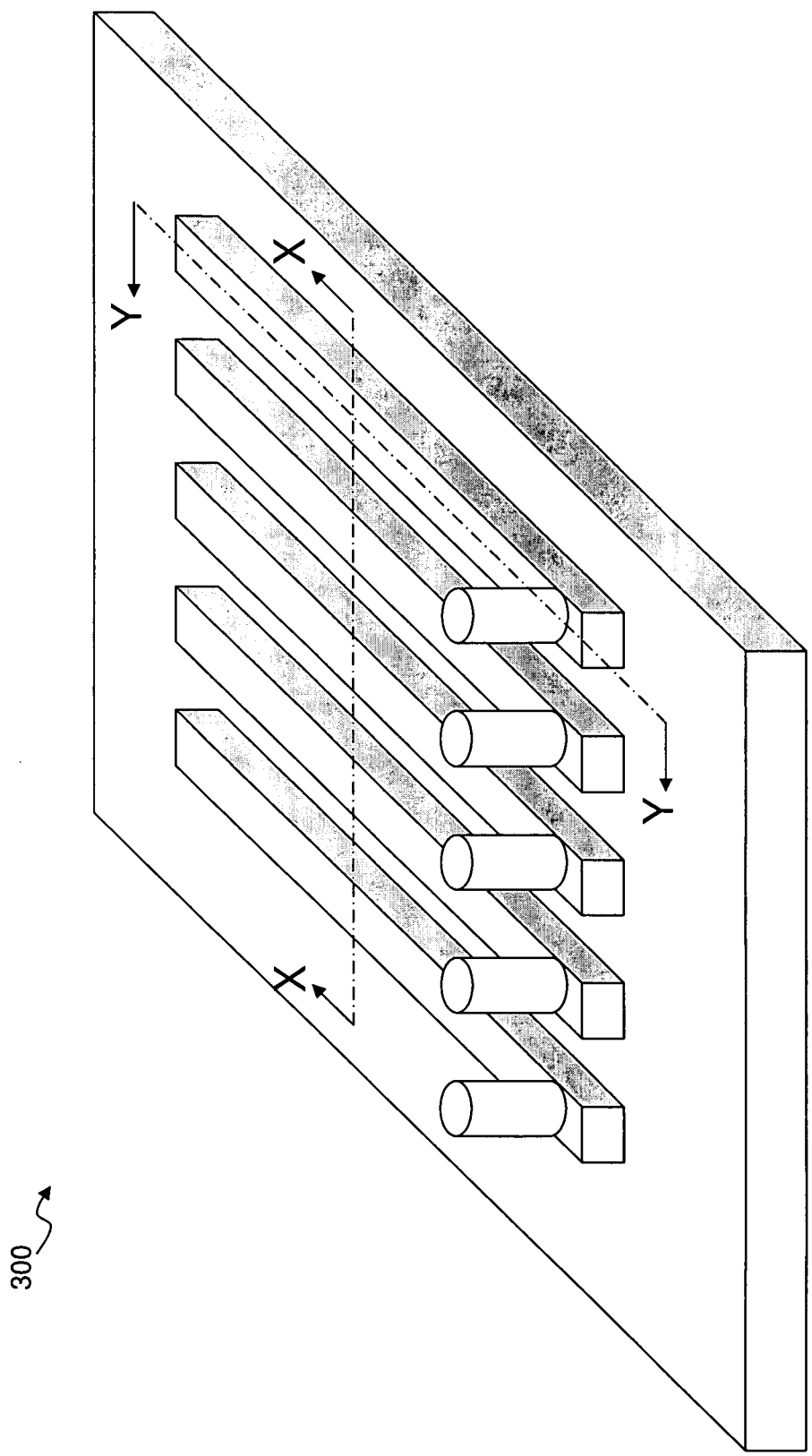
FIG. 3 is a perspective view of a second example imprint lithography mask suitable for forming the memory lines of a three-dimensional memory array according to embodiments of the present invention.

Turning to FIG. 3, a second example of an imprint lithography mask 300 or template suitable for forming the memory lines and vias of a three-dimensional memory array is depicted. The simplified example mask 300 corresponds to the mask 300 used in the processing sequence described below with respect to FIGS. 4AX through 4DX and 4AY through 4DY. As indicated by the X-X cross-sectional cut line and view arrows in FIG. 3, FIGS. 4AX, 4BX, 4CX, and 4DX are cross-sectional views of a sequence of processing steps illustrating the formation of trenches and holes in a dielectric layer for use in manufacturing a memory array. As indicated in FIG. 3, the perspective of the sequence of views is looking down the length of the trenches, away from the pillars of the imprint lithography mask 300. Further, as indicated by the Y-Y cross-sectional cut line and view arrows in FIG. 3, FIGS. 4AY, 4BY, 4CY, and 4DY are also cross-sectional views of the sequence of processing steps illustrating the formation of trenches and holes in the dielectric layer. However, as also indicated in FIG. 3, the perspective of these views is looking across a trench and a via hole with the pillars of the imprint lithography mask 300 disposed on the left hand side of the cross-sectional views. As with the imprint lithography mask 200 described above, the second example of an imprint lithography mask 300 or template may be formed by etching a desired pattern into a translucent blank made from, for example, quartz or fused silica. Further, the imprint lithography mask 300 may also be formed at the minimum dimensions (e.g., line width and pitch) achievable by whichever technology (e.g., 32 nm, 16 nm, 9 nm photolithography, immersion lithography, etc.) may be used to pattern the mask 300. As stated above, because a single mask 300 may be used repeatedly to form many layers of interconnect structures, the cost of manufacturing the mask 300 may be spread over each use of the mask 300. Thus a net manufacturing cost reduction may be achieved by the methods and apparatus of the present invention.

Turning to FIGS. 4AX through 4DX and 4AY through 4DY, a method of forming memory lines and vias for a layer of a three-dimensional memory array is depicted from a front and side plan cross-sectional view, respectively. Note that, as indicated above, each side by side pair of drawings represents a cross-sectional plan view of the same process step where the drawing numbers ending in X are views at the X-X cross-sectional cut line of FIG. 3 and the drawing numbers ending in Y are views at the Y-Y cross-sectional cut line of FIG. 3, respectively. In the step depicted in FIGS. 4AX and 4AY, the inventive process of the present intention may begin with an initial arrangement of various material layers 402-408 selected to be suitable to form the desired devices in a memory array or other circuit.

The imprint lithography mask 300 is shown inserted in a transfer layer 402. Under the transfer layer 402, a hardmask layer 404 has been deposited on a dielectric layer 406 which is on a conductor or wire layer 408. The transfer layer 402 facilitates concurrently transferring both the memory lines pattern and the vias pattern from the imprint lithography mask 300 to the dielectric layer 406. In some embodiments, transfer layer 402 may be a photopolymerizable liquid material that is spin coated or otherwise deposited onto hardmask layer 404. The transfer layer 402, once cured, preferably provides high etch rate selectivity when subjected to subsequent etch processes that facilitate transfer of the desired dual damascene pattern. In some embodiments the transfer layer, 402, may be resist or a conventional photoresist such as, for example, a spun on polymer PMMA and/or photo-curable materials such as those sold by Molecular Imprints Inc. under the name S-FIL Monomat Ac01, which may be cured by exposure to I-line radiation (e.g., 365 nanometers) utilizing a photo source such as 100 Watt Hg—Se ultraviolet arc lamp. Another example of a photo-curable material that may be utilized is a material that includes ethylene glycol diacrylate (3-acryloxypropyl)tris(trimethylsiloxy)silane, t-butyl acrylate, and 2-hydroxy-2-methyl-1-phenyl-propan-1-one. Other practicable materials may be used. In some embodiments, the transfer layer 402 may have an initial thickness in the range of approximately 500 angstroms to approximately 5,000 angstroms.

Between the transfer layer 402 and the dielectric layer 406, a layer of hardmask material 404 may be deposited. In some embodiments, a polycrystalline semiconductor material may be used as a hardmask 404 such as polysilicon, a polycrystalline silicon-germanium alloy, polygermanium or any other suitable material. In other embodiments, a material such as tungsten (W) may be used. The hardmask material layer 404 thickness may be of varying thickness, depending on the etch process parameters used. In some embodiments, the hardmask material layer 404 may have an initial thickness in the range of approximately 500 angstroms to approximately 3000 angstroms.

The dielectric layer 406 is the layer into which the dual damascene interconnect structure is to ultimately be formed. Dielectric layer 406 may include dielectric material or insulating material including silicon based dielectric materials, silicates, low k material, and the like. Silicon based dielectric materials include silicon dioxide ($SiO_2$), silicon nitride, silicon oxynitride, and the like. Silicates include fluorine doped silicon glass (FSG), tetraethylorthosilicate (TEOS), borophosphotetraethylorthosilicate (BPTEOS), phosphosilicate glass (PSG), borophosphosilicate glass (BPSG), and other suitable materials and spin-on glass (SOG). Low k polymer materials include one or more of polyimides, fluorinated polyimides, polysilsequioxane, benzocyclobutene (BCB), poly(arylene ester), parylene F, parylene N, amorphous polytetrafluoroethylene, and the like. Specific examples of a commercially available low k materials include those under the trade designations Flare™ from AlliedSignal, believed to be derived from perfluorobiphenyl and aromatic bisphenols; Black Diamond™ from Applied Materials; ALCAP-S from Asahi Chemical; SiLK™ and Cyclotene™, BCB from Dow Chemical; Teflon™, polytetrafluoroethylene from DuPont; XLK and 3MS from Dow Corning; HSG RZ25 from Hitachi Chemical; HOSP™ and Nanoglass™ from Honeywell Electronic Materials; LKD from JSR Microelectronics; CORAL™ and AF4 from Novellus; mesoporous silica from Battelle PNNL; and Velox™ PAE-2 from Schumacher. In some embodiments, the dielectric layer 406 may have an initial thickness in the range of approximately 1500 angstroms to approximately 10,000 angstroms.

Below the dielectric layer 406, the conductive metal or wire layer 408 may include tungsten (W) or any practicable conductor. In some embodiments, the wire layer 408 may have a thickness in the range of approximately 1000 angstroms to approximately 2000 angstroms. The wire layer 408 may be formed on a substrate (not shown) and/or may be part of another memory level.

The imprint lithography mask 300 is depressed into transfer layer 402. Once the mask 300 is in position, the transfer layer 402 is then hardened by exposure to light (e.g., ultraviolet) or other radiation (e.g., an electron beam) transmitted directly through the translucent imprint lithography mask 300. As shown in FIGS. 4BX and 4BY, the mask 300 is removed after the transfer layer 402 has been cured and a complementary version of the dual damascene features of the mask 300 remains. Next, an etch process is applied to form the structure depicted in FIGS. 4CX and 4CY. In some embodiments, the hardmask layer 404 that is exposed in the via holes is initially etched away. Then, during a partial etch of the dielectric layer 406 that was exposed in the via holes, the transfer layer 402 is eroded through to the hardmask layer 404 in the trench regions.

To form the final structure depicted in FIGS. 4DX and 4DY, the exposed area of hardmask layer 404 in the trenches is etched away and the consequently exposed dielectric layer 406 is etched to form the final trenches. The area of the dielectric layer 406 in the via holes previously exposed, is etched away down to the wire layer 408 to form the final via holes. The remaining dielectric layer 406 is then ready to receive a conductor material in the trenches and via holes.

Turning to FIGS. 5A through 5D, cross-sectional views of various different embodiments of columns of vias (referred to herein as zias) connecting adjacent word line layers and, if present, bit lines at different depths, are depicted. FIG. 5A depicts horizontal word lines 502 connected by three stacked vias 508 forming a zia. The two depths labeled "a" and "b" correspond to the depths of the trenches and holes, respectively, formed by the rails and pillars, respectively, of an imprint lithography mask 300.

FIG. 5B also depicts horizontal word lines 502 connected by stacked vias 508 forming a zia. However, a third damascene feature at a third depth "c" is included in the structure of FIG. 5B. This shoulder at a third depth allows connection to a bit line 504 running perpendicular (i.e., into and out of the page) to the word lines 502 as shown.

Likewise, FIG. 5C also depicts horizontal word lines 502 connected by stacked vias 508 forming a zia and connections to bit lines 504 using a shoulder at an additional depth labeled "d." However, note that depth d is deeper than depth c. This difference in the relative depths of the shoulders facilitates connection to features (e.g., bit lines) at different depths. FIG. 5D includes four depths of imprint a, b, c, d and connection to bit lines at two different depths are thus facilitated.

Figure 6:
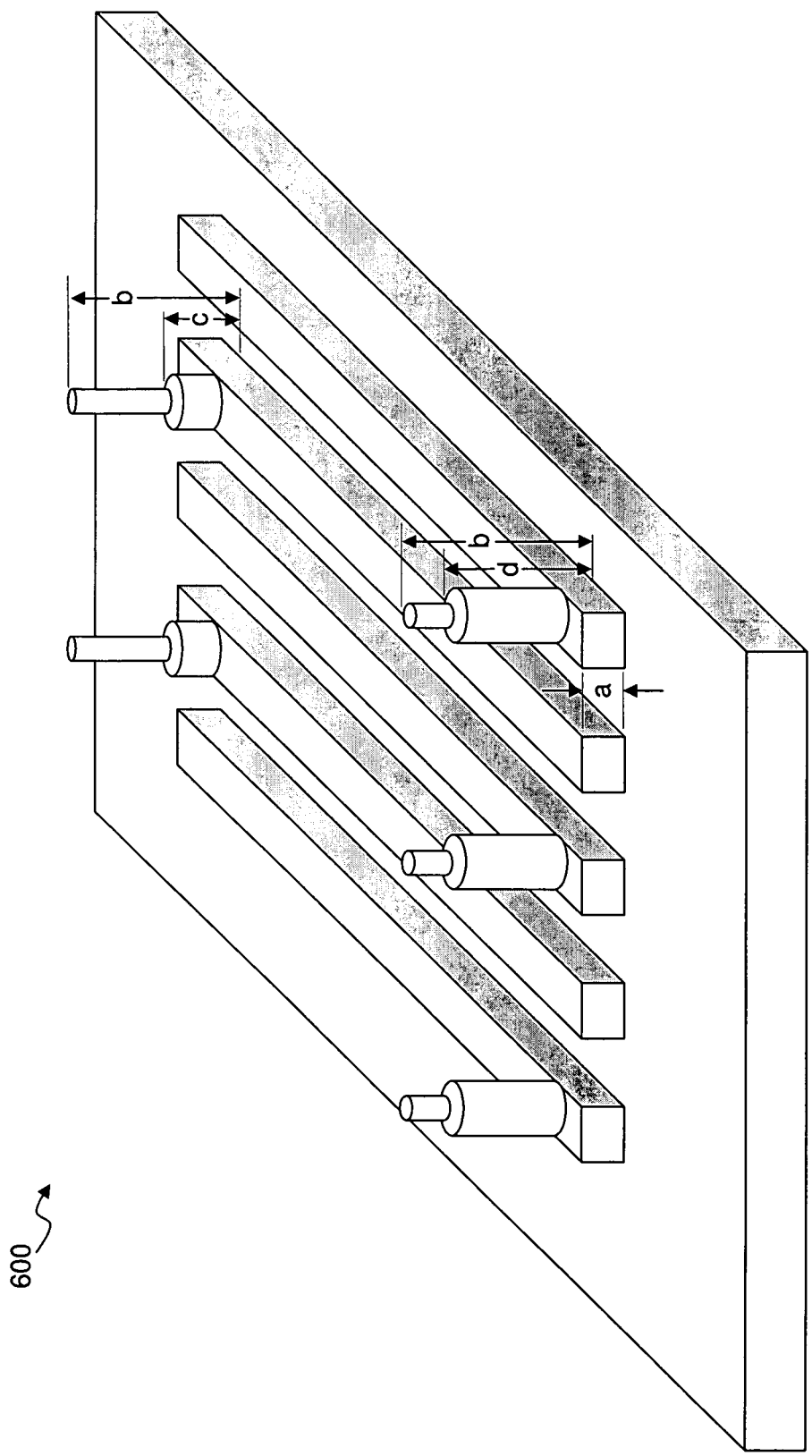
FIG. 6 is a perspective view of a third example imprint lithography mask suitable for forming the memory lines of a three-dimensional memory array according to embodiments of the present invention.

In various embodiments of a three dimensional memory array, different combinations of the depicted zias may be employed together. For example, in a structure where bit lines are run at two different depths, the zias of FIGS. 5B and 5C may be used in an alternating interleaved manner. FIG. 6 depicts an example of an imprint lithography mask 600 that includes interleaved damascene features at four different depths a, b, c, d that could be used to facilitate making interconnections to bit lines 504 at two different depths c, d.

The foregoing description discloses only exemplary embodiments of the invention. Modifications of the above-disclosed embodiments of the present invention which fall within the scope of the invention will be readily apparent to those of ordinary skill in the art. For instance, although only imprint lithography masks having up to four imprint depths where depicted, in some embodiments, any practicable number of imprint depths may be employed.

Accordingly, while the present invention has been disclosed in connection with exemplary embodiments thereof, it should be understood that other embodiments may fall within the spirit and scope of the invention as defined by the following claims.

The invention claimed is:

1. A method of forming a memory layer in a three-dimensional memory array, the method comprising:
forming a template having a plurality of depths, wherein at least one depth corresponds to a first memory line and wherein at least one depth corresponds to a via;
imprinting the template into a transfer material layer formed on a hard mask material layer which is formed on a dielectric layer which is formed on a wire layer;
curing the imprinted transfer material; and
simultaneously etching the cured and imprinted transfer material and the dielectric layer to form a memory layer using the imprinted and cured transfer material,
wherein imprinting the template into the transfer material layer includes imprinting the template into the transfer material layer such that at least one imprint depth reaches the hardmask layer.

2. The method of claim 1 wherein forming the template includes forming the template from at least one of quartz and fused silica.

3. The method of claim 1 wherein forming the template includes forming a template including a plurality of rails corresponding to trenches for a plurality of memory lines.

4. The method of claim 1 wherein forming the template includes forming a template including a plurality of pillars corresponding to holes for a plurality of vias.

5. The method of claim 1 wherein forming the template includes forming a template including a plurality of pillars corresponding to holes for a plurality of vias and a plurality of rails corresponding to trenches for a plurality of memory lines.

6. The method of claim 5 wherein forming the template includes forming the pillars on the rails.

7. The method of claim 6 wherein forming the pillars on the rails includes forming a pillar on an alternate opposite end of each adjacent rail.

8. The method of claim 7 wherein forming the pillars on the rails includes forming pillars on rails having a combined height greater than a height of the rails alone.

9. The method of claim 1 wherein forming the template includes forming a template including a plurality of landings corresponding to contact pads.

10. The method of claim 1 wherein forming the template includes forming a template including a plurality of pillars corresponding to holes for vias, a plurality of rails corresponding to trenches for memory lines, and a plurality of landings corresponding to contact pads.

11. The method of claim 10 wherein forming the template includes forming a landing at an alternate opposite end of each adjacent rail.

12. The method of claim 11 wherein forming the template includes forming the pillars on the landings.

13. The method of claim 1 wherein forming the template includes forming a template including a plurality of pillars wherein at least some of the pillars include at least one shoulder.

14. The method of claim 13 wherein forming a template including a plurality of pillars includes forming pillars with shoulders disposed at a depth to contact a second memory line.

15. The method of claim 1 wherein imprinting the template into a transfer material includes imprinting the template into a transfer material that includes resist.

16. The method of claim 1 wherein imprinting the template into a transfer material includes imprinting the template to form a pattern of trenches and holes in the transfer material.

17. The method of claim 1, wherein forming a memory layer using the imprinted and cured transfer material includes etching the area of hardmask layer reached by the template.

18. The method of claim 17 wherein forming a memory layer using the imprinted and cured transfer material includes etching the dielectric area below the etched area of the hardmask layer to form at least one via hole.

19. The method of claim 1 wherein forming a memory layer using the imprinted and cured transfer material includes etching the transfer material down to the hardmask layer.

20. The method of claim 19 wherein forming a memory layer using the imprinted and cured transfer material includes etching away the hardmask layer previously exposed by etching the transfer material down to the hardmask layer.

21. The method of claim 20 wherein forming a memory layer using the imprinted and cured transfer material includes partially etching the dielectric layer previously exposed by etching away the hardmask layer which was previously exposed by etching the transfer material down to the hardmask layer, wherein the partial etch of the dielectric layer forms at least one trench for a memory line in the dielectric layer.

* * * * *